(12) United States Patent
Petkov

(10) Patent No.: US 10,892,713 B1
(45) Date of Patent: Jan. 12, 2021

(54) RF POWER AMPLIFIER

(71) Applicant: Robert Bosch GmbH, Stuttgart (DE)

(72) Inventor: Vladimir Petkov, San Jose, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/803,232

(22) Filed: Feb. 27, 2020

(51) Int. Cl.
| | |
|---|---|
| *H03F 1/02* | (2006.01) |
| *H03F 1/56* | (2006.01) |
| *H03F 3/21* | (2006.01) |
| *H03F 3/193* | (2006.01) |

(52) U.S. Cl.
CPC .......... *H03F 1/0205* (2013.01); *H03F 1/565* (2013.01); *H03F 3/193* (2013.01); *H03F 3/211* (2013.01)

(58) Field of Classification Search
None
See application file for complete search history.

(56) References Cited

U.S. PATENT DOCUMENTS

| | | | | |
|---|---|---|---|---|
| 2006/0006939 | A1* | 1/2006 | Burns | H04B 1/123 330/124 R |
| 2006/0006946 | A1* | 1/2006 | Burns | H03F 3/211 330/295 |
| 2006/0006949 | A1* | 1/2006 | Burns | H03F 3/195 330/301 |
| 2012/0280746 | A1* | 11/2012 | Deuchars | H03F 1/0277 330/124 R |
| 2012/0299661 | A1* | 11/2012 | Williams | H03F 3/602 330/296 |
| 2013/0027272 | A1* | 1/2013 | Karthaus | H01Q 7/00 343/850 |
| 2013/0293308 | A1* | 11/2013 | Gupta | H03F 3/195 330/293 |
| 2017/0338773 | A1* | 11/2017 | Balteanu | H03F 1/0277 |

\* cited by examiner

*Primary Examiner* — Lincoln D Donovan
*Assistant Examiner* — Khareem E Almo
(74) *Attorney, Agent, or Firm* — Kelly McGlashen

(57) ABSTRACT

A radio frequency (RF) power combiner includes a first port with a first inverting input and a first non-inverting input, a second port with a second inverting input and a second non-inverting input, a first stabilization line coupled between the first non-inverting input and second non-inverting input, and a second stabilization line coupled between the first inverting input and the second inverting input.

20 Claims, 8 Drawing Sheets

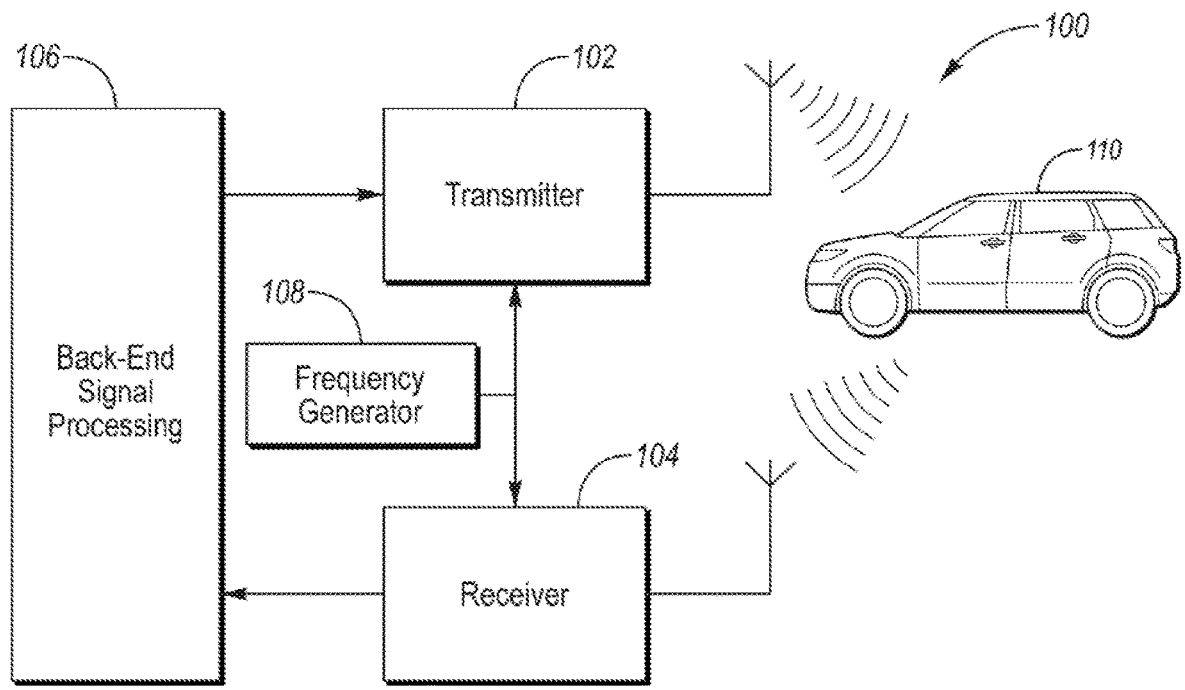
FIG. 1
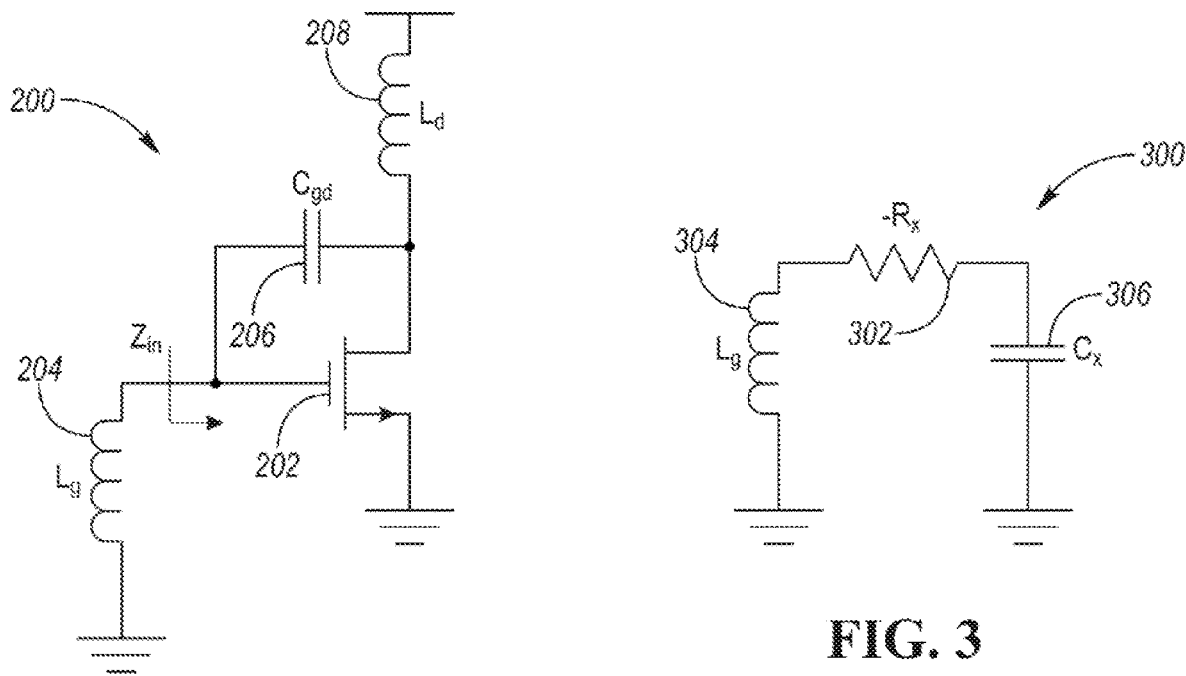
FIG. 2
FIG. 3

RF POWER AMPLIFIER

CROSS-REFERENCE TO RELATED APPLICATIONS

Technical Field

This invention relates generally to a circuit and method of stabilizing a Radio Frequency (RF) power amplifier.

Background

Super High Frequency (SHF) radio frequencies (RF) are in the electromagnetic spectrum range between 3 and 30 gigahertz (GHz), while Extremely High Frequency (EHF) radio frequencies (RF) are in the electromagnetic spectrum from 30 to 300 gigahertz (GHz). SHF RF bands of frequencies are also known as the centimeter band or centimeter wave as the wavelengths range from ten to one centimeters, while EHF RF bands of frequencies are also known at the millimeter band or millimeter wave as the wavelengths range from ten to one millimeter.

Automotive radar is a key component in Advanced Driver Assistance Systems (ADAS) and autonomous driving technology. It provides a 3-D imaging capability which is robust to inclement weather conditions. A key parameter for automotive radar is the maximum range at which a target can be observed. To improve the maximum range sufficient RF power has to be transmitted. Therefore, the power capability of the radar transmitter is an important parameter which may provide a competitive advantage if the technology increases it. The RF power amplifier is a key component in the radar transmitter. It determines the transmitted power level delivered to the antenna. A major design effort is dedicated to maximizing the power output of the RF power amplifier while making sure the amplifier still maintains a stable mode of operation.

SUMMARY

A circuit includes a splitter, a combiner, a first and second pair of transistors, and a first and second stabilization line. The splitter includes a first output port with a first inverting output and a first non-inverting output, and a second output with a second inverting output and a second non-inverting output. The combiner includes a first input port with a first inverting input and a first non-inverting input, and a second input port with a second inverting input and a second non-inverting input. The first pair of transistors, each of which having a first input terminal coupled with ground, a first output terminal coupled with the first input port of the combiner, and a first control terminal driven by the first output of the splitter. The second pair of transistors, each of which having a second input terminal coupled with ground, a second output terminal coupled with the second input port of the combiner, and a second control terminal driven by the second output of the splitter. The first stabilization line coupled between the first non-inverting input and second non-inverting input of the combiner. And the second stabilization line coupled between the first inverting input and the second inverting input of the combiner.

A radio frequency (RF) power combiner includes a first port with a first inverting input and a first non-inverting input, a second port with a second inverting input and a second non-inverting input, a first stabilization line coupled between the first non-inverting input and second non-inverting input, and a second stabilization line coupled between the first inverting input and the second inverting input.

A method to reduce oscillation in four signal system includes receiving a first signal pair including a first inverting signal and first non-inverting signal, and a second signal pair including a second inverting signal and second non-inverting signal. Then amplifying the first inverting signal with a first inverting transistor that couples, at a first inverting input, a first inverting inductor with a supply, amplifying the first non-inverting signal with a first non-inverting transistor that couples, at a first non-inverting input, a first non-inverting inductor with the supply, amplifying the second inverting signal with a second inverting transistor that couples, at a second inverting input, a second inverting inductor with the supply, and amplifying the second non-inverting signal with a second non-inverting transistor that couples, at a second non-inverting input, a second non-inverting inductor with the supply. And, coupling the first non-inverting input and second non-inverting input, and coupling the first inverting input and the second inverting input.

BRIEF DESCRIPTION OF THE DRAWINGS

FIG. 1 is a block diagram of a vehicular radar system.

FIG. 2 is a schematic diagram of a inductively loaded Metal Oxide Semiconductor (MOS) transistor illustrating input impedance.

FIG. 3 is an equivalent LC tank circuit of FIG. 2.

DETAILED DESCRIPTION

Figure 4:
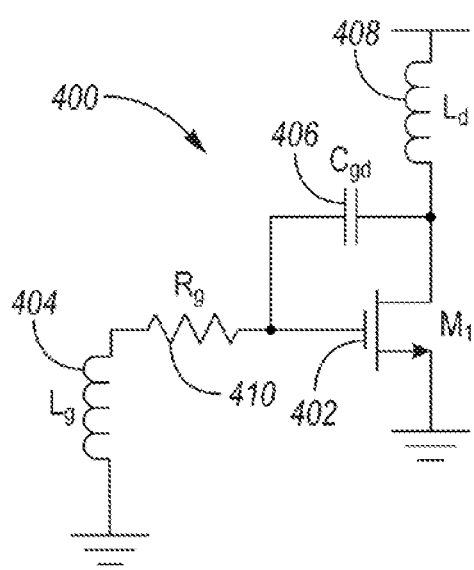
FIG. 4 is a schematic diagram of a single transistor amplifier stage.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and fictional details disclosed herein are not to be interpreted as limiting, but merely as a representative basis for teaching one skilled in the art to variously employ the present invention.

The term "substantially" may be used herein to describe disclosed or claimed embodiments. The term "substantially" may modify a value or relative characteristic disclosed or claimed in the present disclosure. In such instances, "substantially" may signify that the value or relative characteristic it modifies is within +0%, 0.1%, 0.5%, 1%, 2%, 3%, 4%, 5% or 10% of the value or relative characteristic.

As used herein, the term "inverting input" refers to an input that is intended to be substantially out of phase with a reference, often the inverting input is substantially 180 degrees out of phase with the reference. As used herein, the term "non-inverting input" refers to an input that is intended to be substantially in phase with the reference, often the non-inverting input is substantially 0 degrees in phase with the reference.

As used herein, the term "inverting output" refers to an output that is intended to be substantially out of phase with the input, often the inverting output is substantially 180 degrees out of phase with the input. As used herein, the term "non-inverting output" refers to an output that is intended to be substantially in phase with the input, often the non-inverting output is substantially 0 degrees in phase with the input.

One of the challenges in the design of RF and millimeter-wave power amplifiers is to maximize the gain and output power, while ensuring that the circuit remains stable. Instability in high-frequency amplifiers arises from the inherent internal feedback path within the individual transistors, created by the parasitic capacitance from output (drain/collector) to input (gate/base). This feedback can create a negative real impedance at the transistor input, which in turn will result in a condition for oscillation when the remaining passive components at the input form a resonant LC circuit. When the power from multiple transistors is combined at the amplifier output, there can be multiple oscillation modes, each of which needs to be stabilized. Here techniques are disclosed, which stabilize an unwanted oscillation mode in a power-combining amplifier without adversely affecting the desired signal.

FIG. 1 is a block diagram of a vehicular radar system 100. A transmitter 102 transmits a signal that is reflected off an object 110 such as a vehicle. The reflected signal is then detected by a receiver 104. The transmitter 102 and receiver 104 are coupled with a signal processor 106 and a frequency generator 108 which control the signals transmitted and received by the transmitter 102 and receiver 104 respectively. The transmitter incorporates an RF power amplifier, which serves to deliver the required transmitted power to the RF antenna. The amplifier can be implemented using a variety of electronic components. For the purpose of this discussion we will use Metal Oxide Semiconductor Field Effect Transistors (MOSFET) transistors, recognizing that the principles apply to other switching components (e.g., bipolar junction transistors (BJTs), High Electron Mobility Transistors (HEMTs), etc.) and that these switching components may be made using known semiconductor processing materials (e.g., Si based, SiC, GaN, GaAs, AlGaAs, etc.) Often these materials are from group III, IV, or V elements, however other elements may also be used.

FIG. 2 is a schematic diagram of a single MOS transistor amplifier stage 200, having a single MOS transistor 202, a gate to drain capacitance 206, a gate inductance 204, and coupled with an inductive load 208. This schematic also illustrates an input impedance $Z_{in}$. Under the specified assumptions expressed in equation 1, $$\frac{1}{\omega C_{gd}} \gg \omega L_d \tag{1}$$

the impedance, looking into the transistor gate, can have a negative real part and a capacitive imaginary part as expressed in equation 2, $$Z_{in} = \frac{-\frac{g_m L_d}{C_{gd}}}{1+(g_m \omega L_d)^2} - j\frac{\frac{1}{\omega C_{gd}}}{1+(g_m \omega L_d)^2} \tag{2}$$

If this device is combined with an inductor at the input, the overall circuit will form a resonant LC tank with negative real impedance, which is a condition for oscillation. FIG. 3 is an equivalent LC tank circuit 300 of FIG. 2. In the equivalent LC tank circuit 300 of FIG. 3, $R_x$ 302 represents the negative real part of $Z_{in}$, $L_g$ is the gate inductance 304, and $C_x$ 306 is the equivalent capacitance, looking into the transistor's gate. To prevent oscillation, a positive resistor, larger than $R_x$ can be added to the gate.

Figure 5:
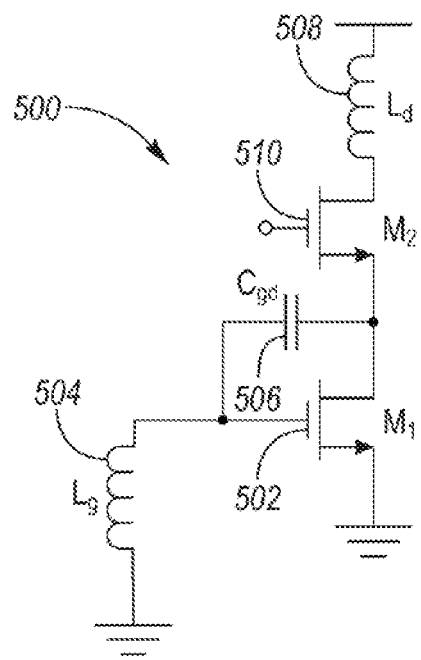
FIG. 5 is a schematic diagram of a transistor amplifier stage with a cascode transistor.

FIG. 4 is a schematic diagram of a single transistor amplifier stage 400. The amplifier stage 400 includes a transistor 402, a gate inductance 404, a gate to drain capacitance 406, a load inductance 408, and a gate resistor 410. The resistor unfortunately dissipates power and adversely affects the power gain of the circuit. Alternatively, a cascode transistor M2 can be added. FIG. 5 is a schematic diagram of a transistor amplifier stage 500 with a cascode transistor. The amplifier stage 500 includes a transistor 502, a gate inductance 504, a gate to drain capacitance 506, a load inductance 508, and a cascode transistor 410. The cascode device creates a low-impedance node at the drain of $M_1$ and highly attenuates the feedback signal through $C_{gd}$. The cascode configuration, however, limits the voltage headroom at the output of the circuit and therefore limits the achievable maximum output power.

Figure 6:
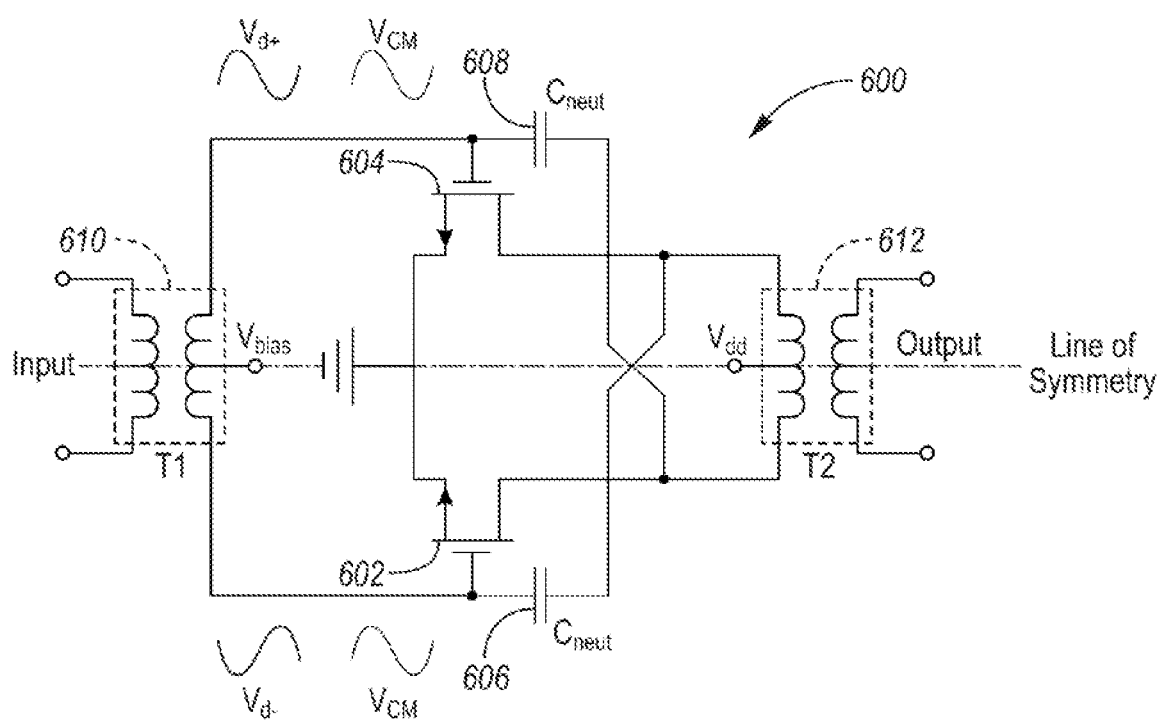
FIG. 6 is a schematic diagram of a differential amplifier illustrating neutralization capacitors.

RF power amplifiers are often implemented as differential circuits, which allows higher output power to be achieved through power combining. A differential signal path also improves the power supply rejection of the circuit. FIG. 6 is a schematic diagram of a differential amplifier 600 illustrating neutralization capacitors 606, 608. The differential amplifier 600 includes a first pair a transistors 602, 604, a splitter 610, and a combiner 612. The differential amplifier stage 600 uses transformers 610, 612 for coupling the signal at its input and output. Such a circuit operates with two types of signals: differential and common-mode. The differential signal ($V_d$) is an excitation of the two transistors with opposite phase, while the common-mode signal ($V_{cm}$) is identical for both transistors. Generally, the differential signal is desired and needs to be amplified, while the common-mode signal is parasitic and has to be attenuated. This is facilitated by the transformers, which provide a low impedance path for the differential signal and high impedance for the common-mode signal. The stability of the amplifier stage, however, should be investigated carefully for both types of signals, to ensure proper operation.

Figure 7:
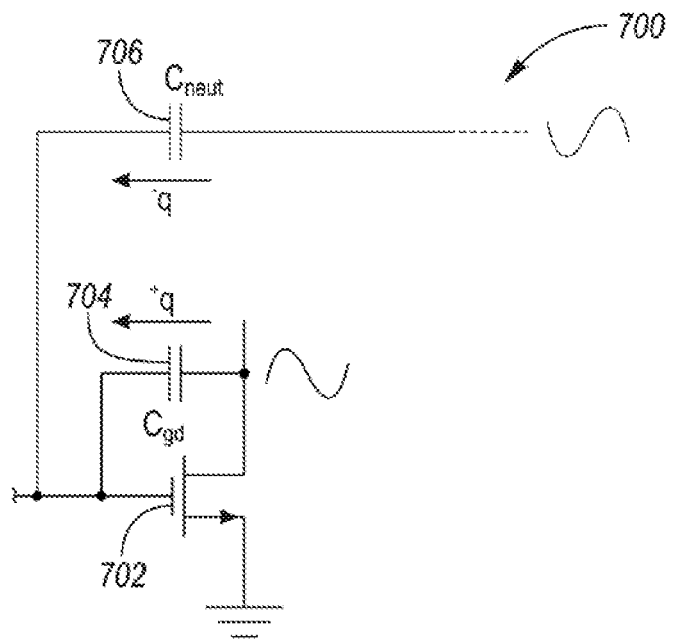
FIG. 7 is a schematic diagram of a neutralization mechanism for Cad.

First considering the differential signal and the corresponding line of symmetry along the circuit. For differential signals, all circuit nodes on the line of symmetry are equivalent to ground connections. Based on this, a similarity between the differential half-circuit (on one side of the line of symmetry) and the inductively loaded transistor from FIG. 2 can be observed. The result from the analysis in FIG. 2 indicates a potential stability problem for the differential signal. The problem arises from the feedback path through capacitor $C_{gd}$. The gate capacitance $C_{gd}$ is internal to the transistor and may not be shown in subsequent figures. If this feedback path is removed, instability will not occur under any conditions. A differential circuit allows an easy way to accomplish this by adding a neutralization capacitor ($C_{neut}$), which injects charge with opposite polarity, taken from the opposite-phase signal path, into the gate. FIG. 7 is a schematic diagram of a neutralization mechanism 700 for $C_{gd}$ in which a transistor 702 with a gate capacitance 704 may be neutralized by a neutralization capacitor $C_{neut}$ 706. As a result, if $C_{neut}=C_{gd}$, the net charge fed back from the drain to the gate is zero and the feedback path is eliminated. This is done for each of the two transistors 602, 604 in FIG. 6.

So far, we solved the amplifier stability problem for differential signals. If we now consider the common-mode signal, we will observe that all the components on both sides of the axis of symmetry are identical and process identical signals. The circuit will once again be reduced to the one shown in FIG. 2, with the important difference that the charge from the neutralization capacitors $C_{neut}$ now adds to the charge through $C_{gd}$ instead of cancelling it. As a result, the neutralization technique, which solves the problem of differential instability, exacerbates the problem of common-mode instability.

Figure 8:
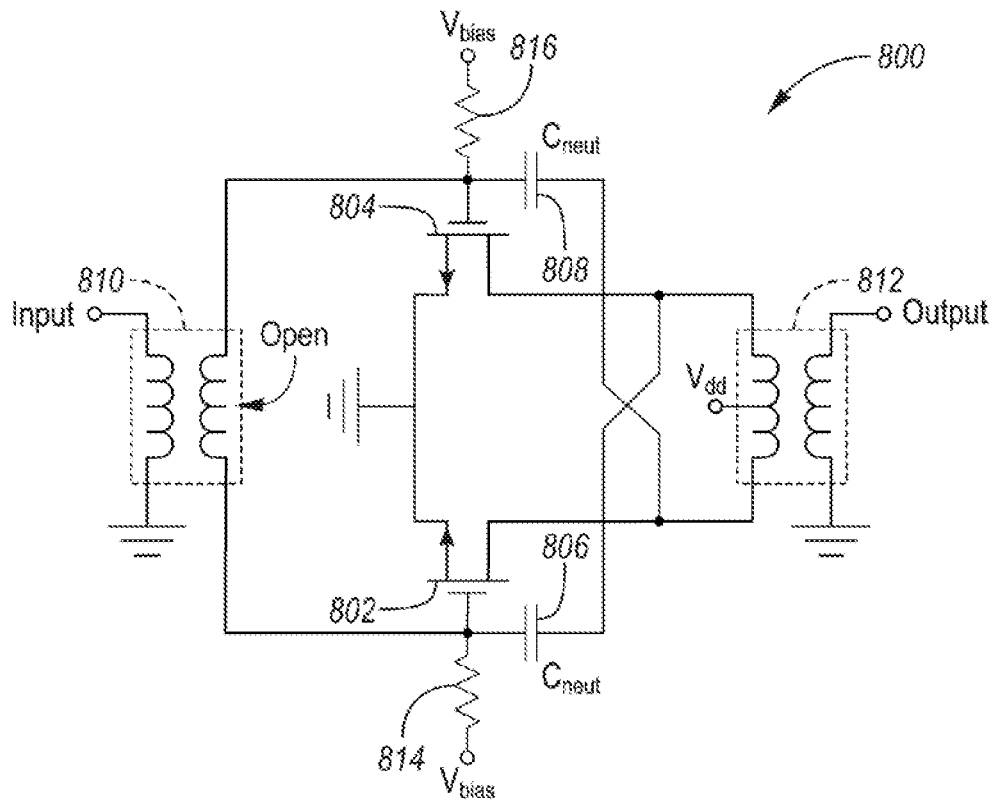
FIG. 8 is a schematic diagram of a differential amplifier modified for common mode stability.
Figure 9:
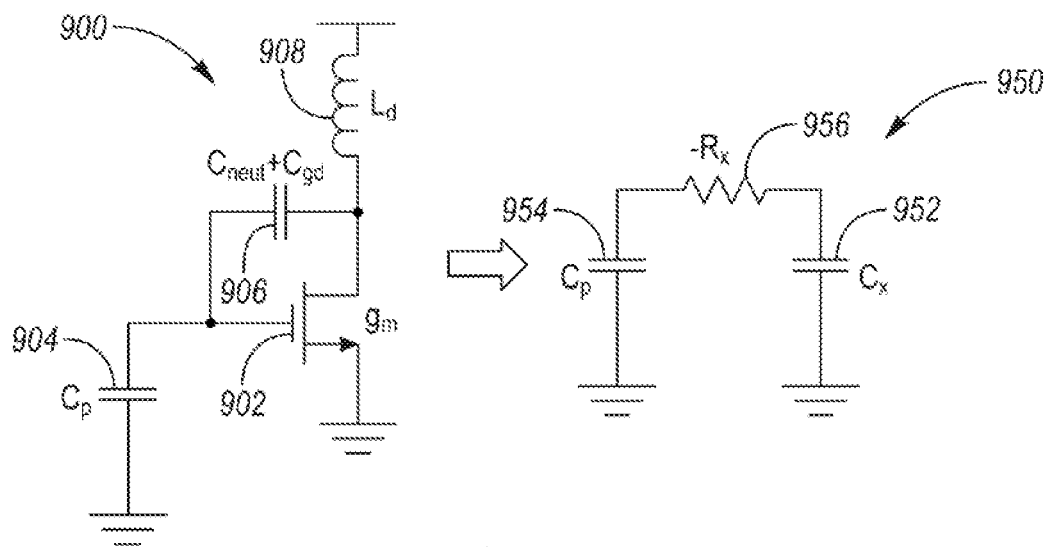
FIG. 9 is a schematic diagram of an equivalent circuit and an equivalent LC tank circuit of FIG. 8.

FIG. 8 is a schematic diagram of a differential amplifier modified for common mode stability. The differential amplifier 800 includes a first pair a transistors 802, 804, a splitter 810, a combiner 812, and bias resistors 814, 816. FIG. 8 shows a circuit modification, which can simultaneously ensure differential and common-mode stability. The large bias resistors 814, 816 are essentially an open circuit at the frequencies of interest. The floating center tap of the input transformer results in an open circuit for common-mode signals. As a result, the input of the circuit only sees the parasitic capacitance, $C_p$, between the transformer winding and ground. FIG. 9 is a schematic diagram of an equivalent circuit 900 and an equivalent LC tank circuit 950 of FIG. 8. The equivalent circuit 900 includes a transistor 902 having a parasitic capacitance, $C_p$ 904 a gate and neutral capacitance 906, and a load inductance 908. Even though the transistor still provides negative real impedance, the absence of a resonant LC tank eliminates the condition for oscillation.

Figure 10:
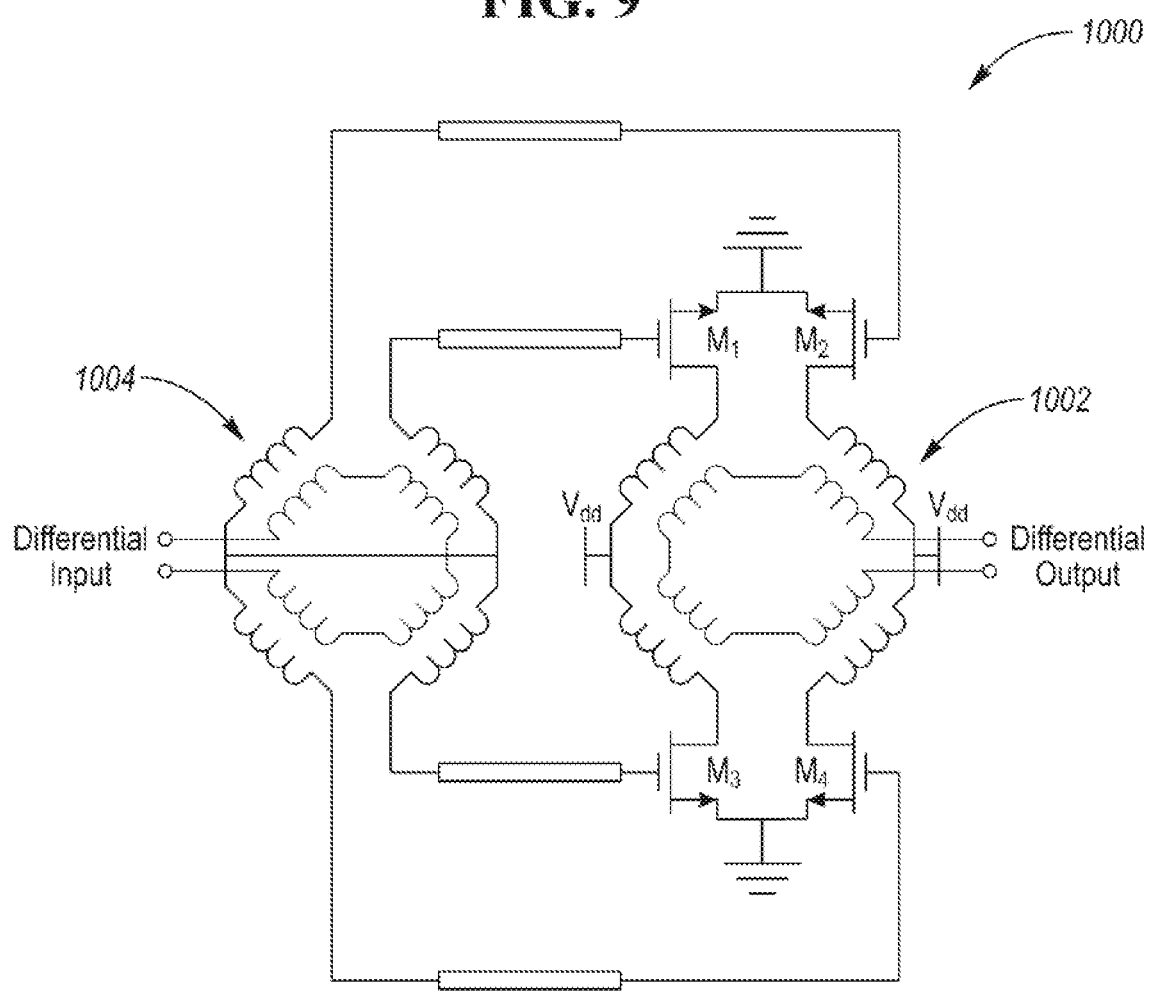
FIG. 10 is a schematic diagram of a four transistor power-combining amplifier stage.

The circuit architecture in FIG. 8 is sufficient to ensure stability in a differential amplifier, which combines the power of two transistors, commonly referred to as a "push-pull" architecture. Often there is a need to supply higher output power, which requires combining more than two signal paths, in which case the above stability measures may be insufficient. FIG. 10 is an example of such amplifier.

FIG. 10 is a schematic diagram of a four transistor power-combining amplifier stage 1000 illustrating a power combiner 1002 and a power splitter 1004. FIG. 10 illustrates a power-combining amplifier with four output transistors. The input is supplied by a differential driver stage (not shown), similar to the one in FIG. 8. The input power is divided by the power splitter and supplied to the four transistors of the output stage, whose amplified output power is subsequently combined by the power combiner to provide a differential output. This architecture is capable of providing higher power compared to a differential push-pull amplifier. A four-transistor amplifier combines signals of two differential amplifiers. Therefore, ideally it will provide twice the output power, but due to losses in the passive components, the actual power increase is slightly less. For factors higher than two, A power combiner with more transistors is typically used (e.g., 8 transistors for a power factor increase of 4). The general case of N stages is called a Distributed Active Transformer (DAT) amplifier. Although the disclosure is shown for a four-transistor amplifier, the techniques can be applied to amplifiers with more stages.

Figures 11A, 11B, 11C, 11D:
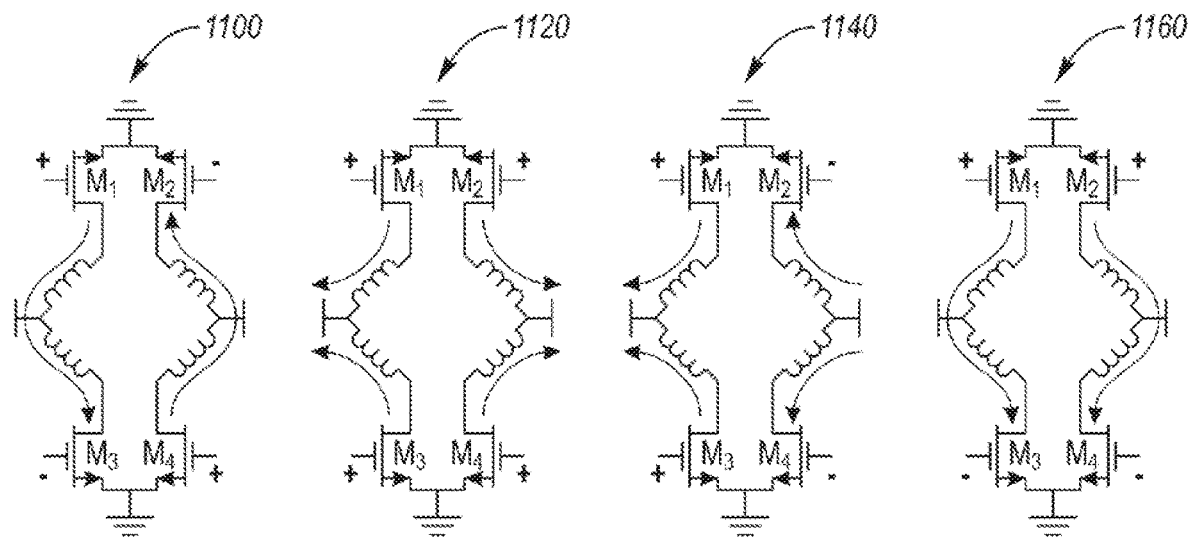
FIG. 11A is a schematic diagram of a four transistor power-combining amplifier stage in a differential mode.
FIG. 11B is a schematic diagram of a four transistor power-combining amplifier stage in a common mode.
FIG. 11C is a schematic diagram of a four transistor power-combining amplifier stage in a first hybrid mode.
FIG. 11D is a schematic diagram of a four transistor power-combining amplifier stage in a second hybrid mode.

In the previous section, it was shown that a differential amplifier stage can process two types of signals, depending on their polarity: i.) differential and ii.) common-mode. Also, measures for stabilizing the amplifier with respect to both signals were disclosed. In an amplifier with four output transistors, there are two additional degrees of freedom, producing a total of four possible signal configurations or modes. FIGS. 11A-D show the four possibilities. FIG. 11A is a schematic diagram of a four transistor power-combining amplifier stage in a differential mode. FIG. 11B is a schematic diagram of a four transistor power-combining amplifier stage in a common mode. FIG. 11C is a schematic diagram of a four transistor power-combining amplifier stage in a first hybrid mode. FIG. 11D is a schematic diagram of a four transistor power-combining amplifier stage in a second hybrid mode.

Figure 12:
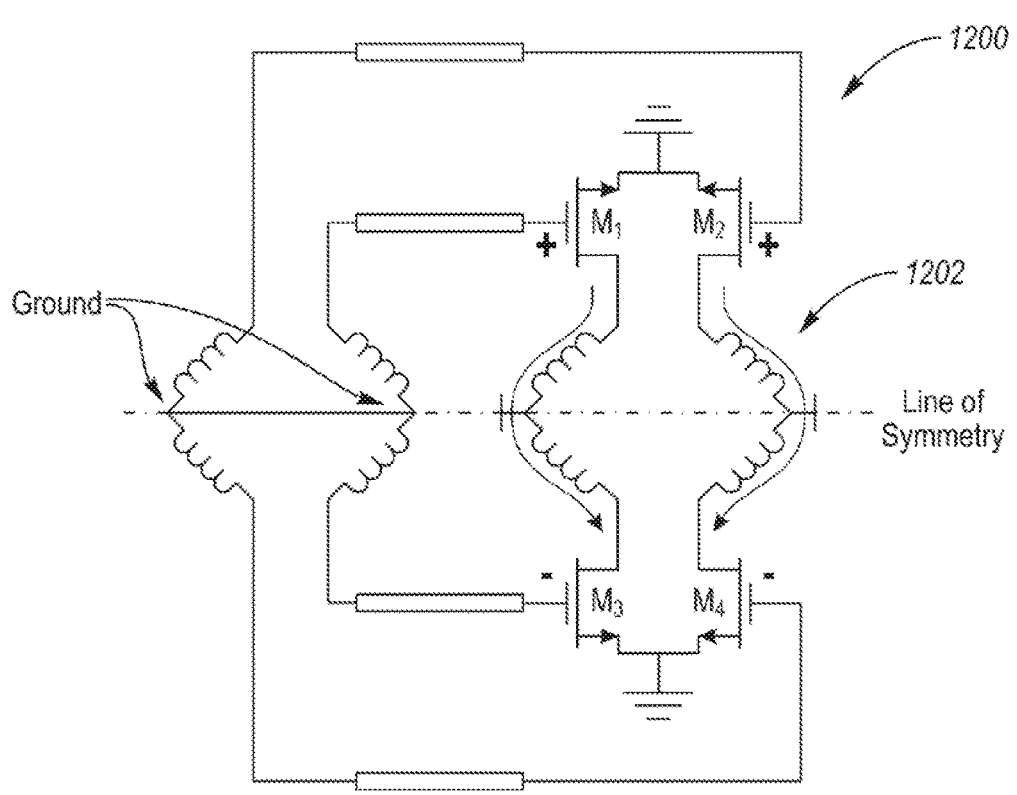
FIG. 12 is a schematic diagram of a four transistor power-combining amplifier stage in a second hybrid mode illustrating an oscillation mechanism.
Figure 13:
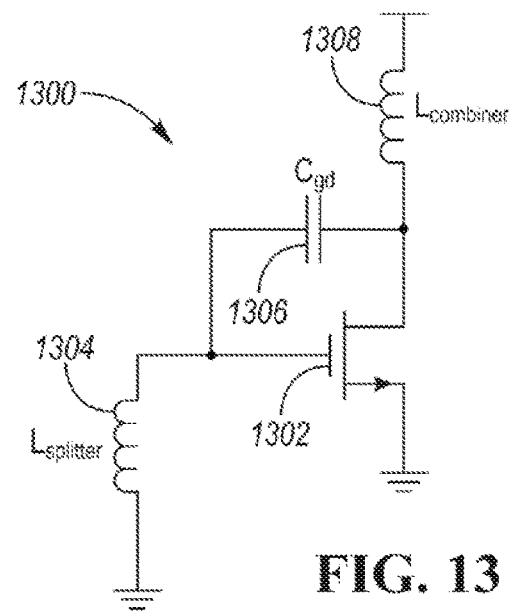
FIG. 13 is a schematic diagram of an equivalent circuit of FIG. 12.

Along with recognizing the differential and common-mode signals, in addition there are two hybrid modes. The differential and common-mode stability can be ensured using the approach from the previous section. Adding neutralization capacitors to the transistor pairs $M_1$-$M_2$ and $M_3$-$M_4$ will ensure the stability of the differential mode (FIG. 11A) and hybrid mode 1 (FIG. 11C). Leaving the power splitter floating and using large resistors to bias all four transistors will ensure the stability of the common mode (FIG. 11B), similar to the conventional solution for the differential push-pull amplifier in FIG. 8. Hybrid mode 2 (FIG. 11D), however, does not benefit from any of the above measures and can be prone to oscillation. FIG. 12 shows the equivalence between the output stage in hybrid mode 2 and the circuit in FIG. 12 is a schematic diagram of a four transistor power-combining amplifier stage 1200 in a second hybrid mode illustrating an oscillation mechanism through the power combiner 1202. FIG. 13 is a schematic diagram of an equivalent circuit 1300 of FIG. 12. The amplifier stage 1300, having a single MOS transistor 1302, a gate to drain capacitance 1306, a gate inductance 1304, and coupled with an inductive load 1308. In which the gate inductance 1304 includes the inductance of the power splitter (e.g., 1004, 1404) and the inductive load 1308 includes the inductance of the power combiner (e.g., 1002, 1402).

One possible solution to this stability problem is to introduce separate transformers in front of the transistor pairs $M_1$-$M_2$ and $M_3$-$M_4$, which would isolate the inductance of the power splitter from the transistor gates, similar to the solution in FIG. 6. The disadvantage of this approach is a sizeable increase in the required circuit area due to the additional transformers.

Figure 14:
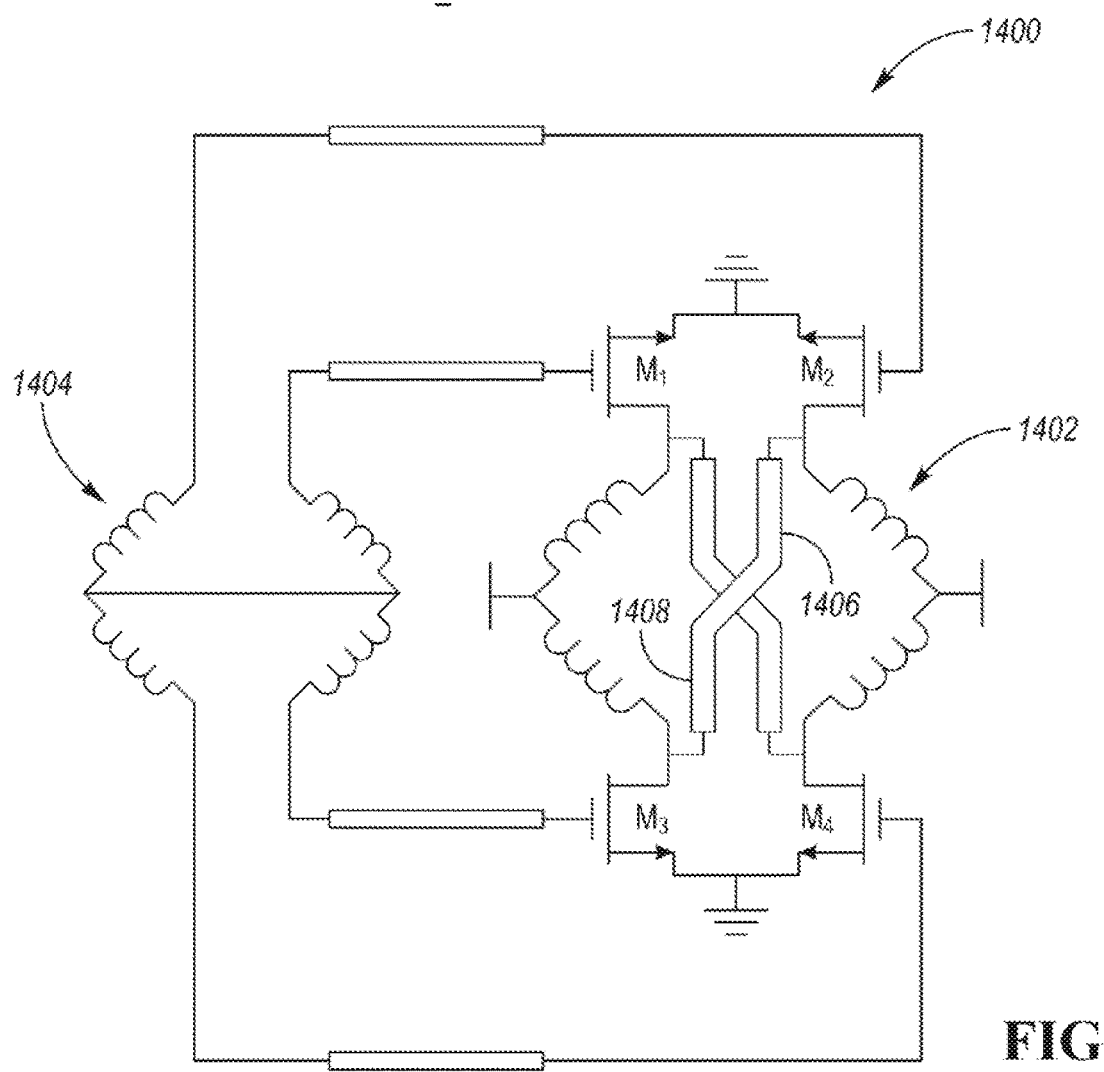
FIG. 14 is a schematic diagram of a four transistor power-combining amplifier stage with a stabilization mechanism.

This disclosure presents an area-efficient circuit solution, which prevents the hybrid modes from oscillating, without adversely affecting the signal of the desired differential mode. First, consider the signal of the desired differential mode (FIG. 11A) and observe that the signals processed by transistors $M_1$ and $N_4$ are nominally identical, with the same amplitude and phase. The same is true for the signals of $M_2$ and $M_3$. Therefore, by short circuiting the drains of $M_1$ and $M_4$ as well as the drains of $M_2$ and $M_3$, the operation of the circuit in its differential mode will be unaltered, since no current will flow through the short circuit segments (i.e., the voltages on both terminals of each short circuit segment are identical). FIG. 14 shows the presented modification, in which the short circuit segments are implemented with transmission lines. The differential signal mode is processed unaltered by this circuit.

FIG. 14 is a schematic diagram of a four transistor power-combining amplifier stage 1400 with a stabilization mechanism. The amplifier stage 1400 includes a power combiner 1402, a power splitter 1404, and a first stabilization line 1406, and a second stabilization line 1408. The stabilization lines 1406, 1408 may be constructed of a metal, polysilicon or other conductive material or element (e.g., Aluminum (Al), Gallium (Ga), Tin (Sn), Nickel (Ni), Copper (Cu), Silver (Ag), Gold (Au), etc.). The stabilization lines 1406, 1408 may be transmission lines. Although the size is not a determining factor, the stabilization lines need to be as short as possible having a length that is typically determined by the size of the combiner, as they cross from one side of the combiner to the other. In general, the stabilization lines are "wires" to short the signals, but "wires" at millimeter-wave frequencies act as an inductors. The transmission lines minimize the inductance by keeping the return path of the current as short as possible. The stabilization lines may include components such as a switch or transistor in which the transistor is turned on to short the signals if the combiner operates in the second hybrid mode as described below.

Now consider the two unwanted hybrid modes (FIG. 11C and FIG. 11D). It can be observed that in both of these modes the signals through transistor pairs $M_1$ and $M_4$ as well as $M_2$ and $M_3$ are opposite in phase. The short circuit segments in FIG. 14 will therefore introduce significant power loss for both hybrid modes. This effectively means that the hybrid modes cannot be excited and oscillation is not possible.

The proposed solution in FIG. 14 therefore allows us to stabilize the hybrid modes by eliminating the condition for their oscillation, while at the same time leaving the desired differential mode intact. Here transistor M1 is coupled to the first inverting input to the combiner, M2 is coupled to the first non-inverting input to the combiner, M3 is coupled to the second non-inverting input to the combiner, and M4 is coupled to the second inverting input to the combiner. Therefore, when the circuit is operating in Hybrid mode 2 (FIG. 11D), coupling the first inverting input to the combiner with the second inverting input to the combiner and coupling the first non-inverting input to the combiner with the second non-inverting input to the combiner will reduce common mode oscillation.

In the discussion above we considered both hybrid modes in order to show that the solution applies equally to both, even though hybrid mode 1 is already stabilized with the addition of neutralization capacitors and it is only hybrid mode 2 that is at risk of oscillation and therefore of interest.

Figure 15:
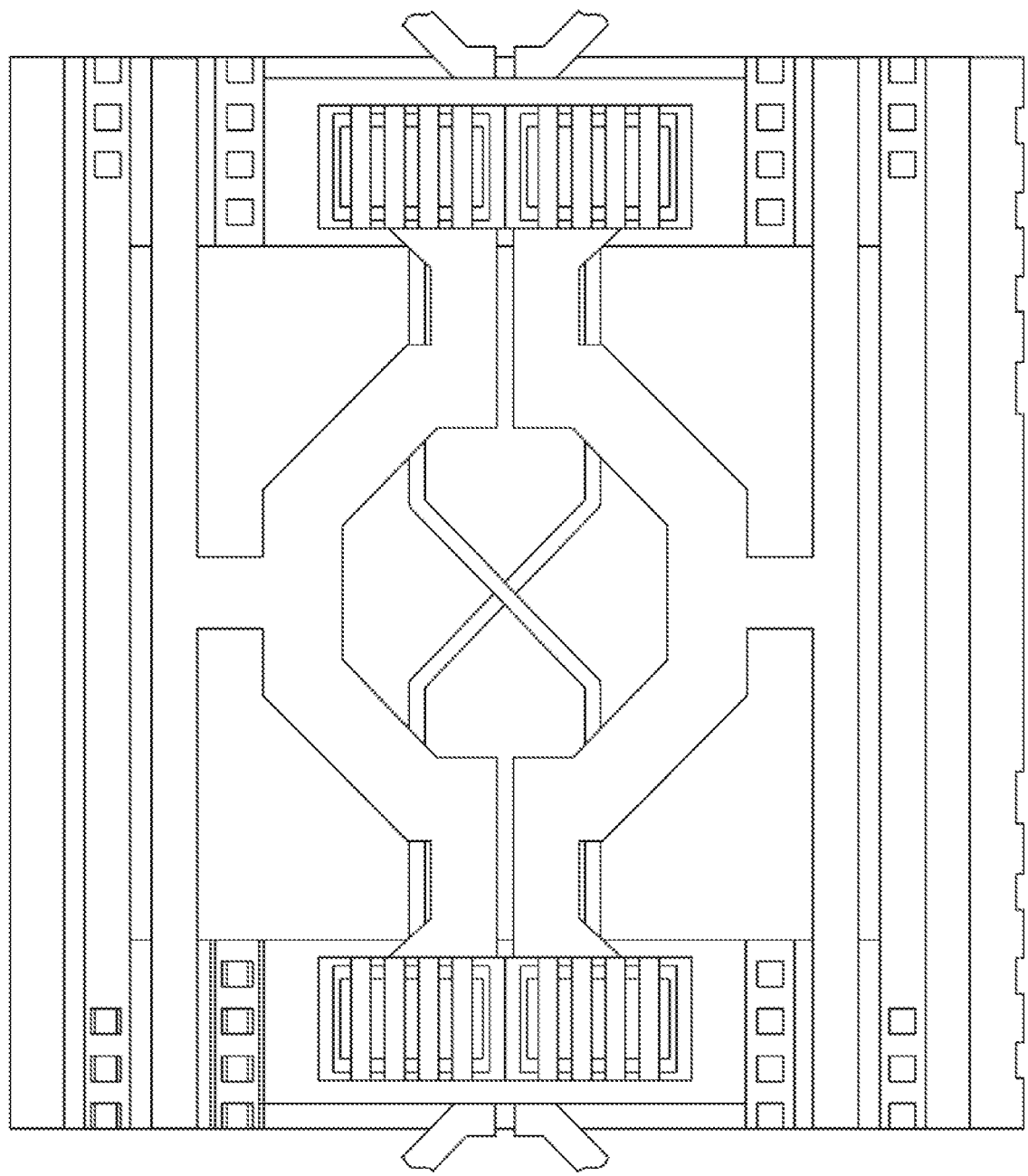
FIG. 15 is a top view of a semiconductor layout of a four transistor power-combining amplifier stage with a stabilization mechanism.
Figure 16:
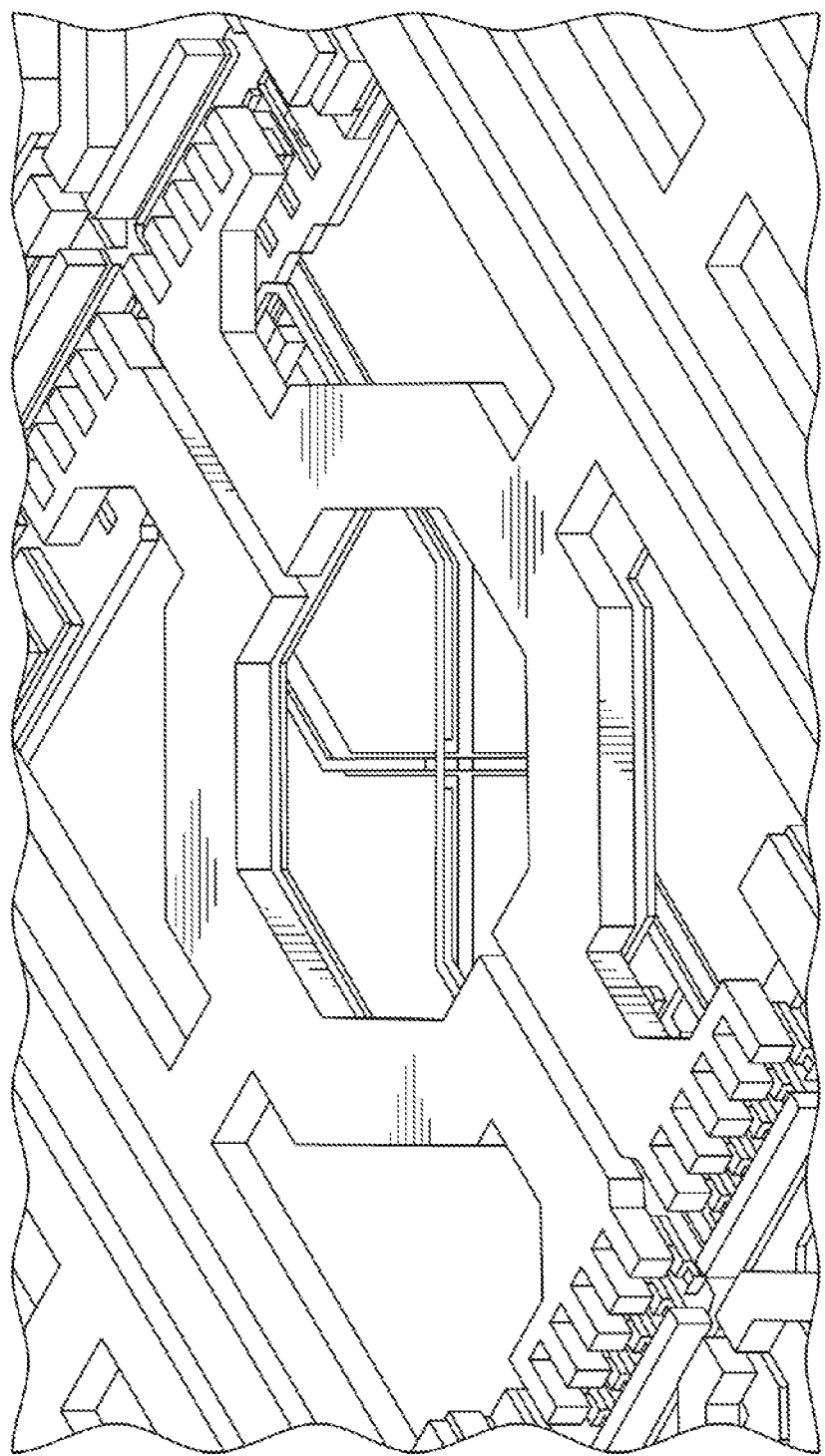
FIG. 16 is a perspective view of a semiconductor layout of a four transistor power-combining amplifier stage with a stabilization mechanism.

FIG. 15 and FIG. 16 show a practical geometric implementation of the proposed solution. FIG. 15 is a top view of a semiconductor layout of a four transistor power-combining amplifier stage with a stabilization mechanism. FIG. 16 is a perspective view of a semiconductor layout of a four transistor power-combining amplifier stage with a stabilization mechanism.

While all of the invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of the general inventive concept.

What is claimed is:

1. A circuit comprising:
   a splitter having a first output port with a first inverting output and a first non-inverting output, and a second output with a second inverting output and a second non-inverting output;
   a combiner having a first input port with a first inverting input and a first non-inverting input, and a second input port with a second inverting input and a second non-inverting input;
   a first pair of transistors each of which having a first input terminal coupled with ground, a first output terminal coupled with the first input port of the combiner, and a first control terminal driven by the first output port of the splitter;
   a second pair of transistors each of which having a second input terminal coupled with ground, a second output terminal coupled with the second input port of the combiner, and a second control terminal driven by the second output of the splitter;
   a first stabilization line coupled between the first non-inverting input and second non-inverting input of the combiner; and
   a second stabilization line coupled between the first inverting input and the second inverting input of the combiner.

2. The circuit of claim 1, wherein the transistors are Metal Oxide Semiconductor Field Effect Transistors (MOSFETs) and the input terminals are source terminals, the output terminals are drain terminals, and the control terminals are gate terminals.

3. The circuit of claim 1, wherein the transistors are Bipolar Junction Transistors (BJTs) and the input terminals are emitter terminals, the output terminals are collector terminals, and the control terminals are base terminals.

4. The circuit of claim 1, wherein the first stabilization line and second stabilization line are Al or Cu.

5. The circuit of claim 1, wherein the first stabilization line includes a first inductor and the second stabilization line includes a second inductor.

6. The circuit of claim 1, wherein the first stabilization line includes a first capacitor and the second stabilization line includes a second capacitor.

7. The circuit of claim 1, wherein the first stabilization line includes a first resistor and the second stabilization line includes a second resistor.

8. The circuit of claim 1, wherein the splitter includes 4 inductive output segments and the combiner includes 4 inductive input segments.

9. The circuit of claim 1, wherein the combiner and splitter are configured to operate at frequencies at or above 20 GHz.

10. A radio frequency (RF) power combiner comprising:
a first port with a first inverting input and a first non-inverting input;
a second port with a second inverting input and a second non-inverting input;
a first stabilization line coupled between the first non-inverting input and second non-inverting input; and
a second stabilization line coupled between the first inverting input and the second inverting input.

11. The RF power combiner of claim 10, wherein the RF power combiner is configured to operate at frequencies at or above 20 GHz.

12. The RF power combiner of claim 10 further comprising a first inductor coupled between the first non-inverting input and a power terminal, a second inductor coupled between the first inverting input and the power terminal, a third inductor coupled between the second non-inverting input and the power terminal, and a fourth inductor coupled between the second inverting input and the power terminal.

13. The RF combiner of claim 12, wherein the first inverting input is substantially in phase with the second inverting input and the first non-inverting input is substantially in phase with the second non-inverting input, while inverting and non-inverting inputs are out of phase.

14. The RF combiner of claim 10, wherein the first stabilization line includes a first inductor and the second stabilization line includes a second inductor.

15. The RF combiner of claim 10, wherein the first stabilization line includes a first capacitor and the second stabilization line includes a second capacitor.

16. A method to reduce oscillation in four signal system comprising:
receiving a first signal pair including a first inverting signal and first non-inverting signal, and a second signal pair including a second inverting signal and second non-inverting signal;
amplifying the first inverting signal with a first inverting transistor that couples, at a first inverting input, a first inverting inductor with a supply;
amplifying the first non-inverting signal with a first non-inverting transistor that couples, at a first non-inverting input, a first non-inverting inductor with the supply;
amplifying the second inverting signal with a second inverting transistor that couples, at a second inverting input, a second inverting inductor with the supply;
amplifying the second non-inverting signal with a second non-inverting transistor that couples, at a second non-inverting input, a second non-inverting inductor with the supply;
coupling the first non-inverting input and second non-inverting input; and
coupling the first inverting input and the second inverting input.

17. The method of claim 16, wherein coupling the first non-inverting input and second non-inverting input is in response to the first non-inverting transistor and first inverting transistor operating in a common-mode, and
coupling the first inverting transistor and the second inverting transistor is in response to the second non-inverting transistor and second inverting transistor operating in a common-mode.

18. The method of claim 17, wherein coupling the first non-inverting input and second non-inverting input is via a first inductor and coupling the first inverting input and the second inverting input is via a second inductor.

19. The method of claim 17, wherein coupling the first non-inverting input and second non-inverting input is via a first capacitor and coupling the first inverting input and the second inverting input is via a second capacitor.

20. The method of claim 17, wherein coupling the first non-inverting input and second non-inverting input is via a first stabilization transistor and coupling the first inverting input and the second inverting input is via a second stabilization transistor.

* * * * *